United States Patent [19]

Lee

[11] Patent Number: 4,986,879

[45] Date of Patent: * Jan. 22, 1991

[54] STRUCTURE AND PROCESS FOR FORMING SEMICONDUCTOR FIELD OXIDE USING A SEALING SIDEWALL OF CONSUMABLE NITRIDE

[75] Inventor: Steven S. Lee, Colorado Springs, Colo.

[73] Assignee: NCR Corporation, Dayton, Ohio

[*] Notice: The portion of the term of this patent subsequent to May 8, 2007 has been disclaimed.

[21] Appl. No.: 436,567

[22] Filed: Mar. 19, 1990

Related U.S. Application Data

[63] Continuation-in-part of Ser. No. 356,591, May 22, 1989, Pat. No. 4,923,563, which is a continuation of Ser. No. 61,923, Jun. 15, 1987, abandoned.

[51] Int. Cl.⁵ .................. B05D 5/12; H01L 21/306
[52] U.S. Cl. ............................ 156/649; 156/653; 156/657; 156/659.1; 156/662; 437/69; 437/70; 437/72; 437/73; 437/238; 437/241; 357/49; 357/50; 357/54
[58] Field of Search .............. 437/69, 70, 72, 73, 437/228, 238, 241; 156/649, 653, 657, 662, 659.1; 357/23.11, 50, 54, 49

[56] References Cited

PUBLICATIONS

Chiu et al, "The Sloped-Wall SWAMI—A Defect-Free Zero Bird's Beak Local Oxidation Process for Scaled VLSI Technology", *IEEE Transactions on Electron Devices*, vol. ED30, No. 11, Nov. 1983.

Primary Examiner—David A. Simmons
Assistant Examiner—Thi Dang
Attorney, Agent, or Firm—Wilbert Hawk, Jr.; Stephen F. Jewett; Douglas S. Foote

[57] ABSTRACT

An integrated circuit structure and fabrication process for creating field oxide regions having substantially no bird's beak, a relatively planar concluding surface, substantially no stress induced dislocations at the edges of the active regions, and a substantial absence of notches or grooves at the edges of the active silicon, by a selective combination of material dimensions and process operations. In one form of practicing the invention, the process utilizes a relatively thick pad oxide below the masking nitride layer, and a second, very thin, sidewall masking nitride layer. The thin sidewall masking nitride layer does not utilize an underlying pad oxide layer, but may include a thin underlying screening oxide. Upon oxidation, the thin sidewall nitride is concurrently lifted and converted to oxide, the materials and dimension being selected to ensure that when the field oxide level approaches the level of the thick pad oxide layer stresses at the corners of the active silicon region are relieved through various oxide paths and accentuated oxidation effects.

12 Claims, 2 Drawing Sheets

STRUCTURE AND PROCESS FOR FORMING SEMICONDUCTOR FIELD OXIDE USING A SEALING SIDEWALL OF CONSUMABLE NITRIDE

CROSS-REFERENCE TO RELATED APPLICATION

This is a continuation-in-part of application Ser. No. 356,591, filed on May 22, 1989, now U.S. Pat. No. 4,923,563, which is a continuation of application Ser. No. 061,923, filed on June 15, 1987, now abandoned.

BRIEF SUMMARY

The present invention relates in general to a method of making integrated electronic circuits and more particularly to a process for forming field regions filled with silicon dioxide dielectric between active regions of a silicon substrate. In its preferred practice, the invention utilizes selectively combined and varied features from existing technologies to define a commercially viable fabrication sequence having numerous distinct and desirable attributes.

In one practice of the present invention, the formation of field oxide regions between active regions in a semiconductor substrate begins with the formation of a pad silicon dioxide (pad oxide) layer, having a nominal thickness in the range of 50 nm or greater, over the substrate surface. The term "pad oxide" as used herein refers to an oxide layer whose primary function is to provide stress relief to an overlying nitride layer. The pad oxide layer is covered in otherwise conventional manner with a succeeding layer of silicon nitride (nitride), the nitride having a nominal thickness of 100 nm or greater. Using a photolithographically patterned mask of photoresist, the structure is then subjected to an anisotropic etch, such as reactive ion etching (RIE), through the nitride layer, the pad oxide layer, and into the silicon substrate to form a recess, with the composite etched structure exhibiting substantially vertical sidewalls. The preferred practice of the invention next includes a low pressure chemical vapor deposition (LPCVD) formation of a very thin and conformal silicon nitride layer, nominally 10–13 nm thick, followed by an anisotropic etch to remove the second nitride layer from all horizontally disposed surfaces. Field oxide growth follows.

Note that the substrate structure at the start of the field oxide growth step includes active regions covered by a relatively thick pad oxide layer and a relatively thick first nitride layer. The relatively thin second nitride layer covers the vertical sidewalls from the first nitride layer to the bottom of the recess into the substrate. No pad oxide is used beneath the second silicon nitride layer. However, according to an alternative embodiment of the present invention, a relatively thin screening oxide may be so used.

The substrate is subjected to oxidation under conventional conditions, causing a concurrent and interactive response whereby oxidation is initially restricted to the bottom of the recess in the silicon substrate, and progresses laterally into the silicon sidewalls only after a lifting or bending of the thin silicon nitride covering the sidewalls. The lifting or bending of the sidewall nitride begins at the bottom of the recess and progresses upward in relation to the growth of the silicon dioxide. The absence of a pad oxide beneath the thin sidewall nitride constrains the progression of the oxidation beneath the thin sidewall nitride layer. As the level of the oxidation reaches the relatively thick pad oxide layer, oxide formation stresses are relieved. Further stress relief occurs from the substantial conversion of the thin sidewall nitride into oxide as the oxidation reaches the level of the pad oxide. Upon such oxidation of the thin sidewall nitride, the edge of the active region is rapidly oxidizes, to provide a smooth contour and to further relieve any stresses which would otherwise create dislocations in the active region silicon at the edge of the field oxide region.

The sidewall nitride masking and controlled lifting focuses the oxidation to the center of the recess in the substrate, minimizing the creation of notches or grooves at the edges of the active regions in that significant oxide is not grown around the lower corner of the thick silicon nitride layer.

Following oxidation and a strip of the first nitride and the pad oxide layers, fabrication of the integrated circuits continues in otherwise normal manner.

These and other features of the invention will be more fully understood and appreciated upon considering the detailed description which follows.

DETAILED DESCRIPTION

Figure 1:
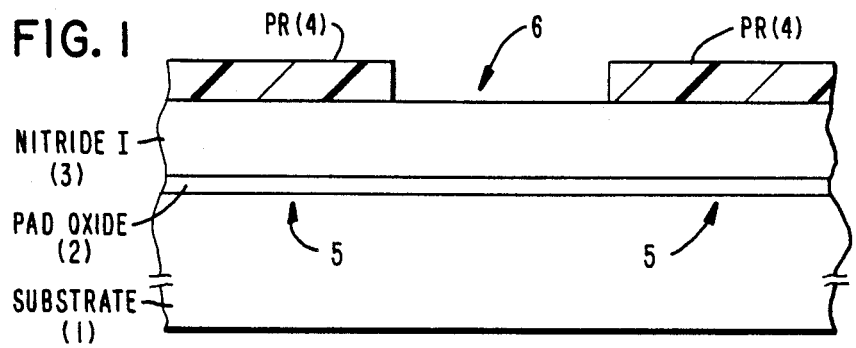
FIGS. 1–3 are cross-sectional schematic representations of an integrated circuit substrate at various stages in the fabrication sequence prior to field oxide growth.

The fabrication of an integrated circuit normally begins by processing the semiconductor substrate or wafer to divide the surface area into first regions, where active devices and substrate imbedded interconnects are to be formed, and second regions of dielectric, which electrically separate the first active regions. The field oxide dielectric material is routinely silicon dioxide. Though various field oxide formation techniques have been developed and described, the technique commonly known as the localized oxidation of silicon (LOCOS) remains prevalent if not dominate within the semiconductor industry. In the practice of LOCOS, the active regions of the silicon substrate are masked by a silicon nitride layer, while the field oxide regions are thermally oxidized to form a field dielectric region. Though fundamentally simple and efficient, the LOCOS process, and its progeny, such as the FUROX and SWAMI techniques, exhibit deficiencies which reduce yield or performance in the final semiconductor chip product.

The most frequently encountered deficiency in the prior art techniques is commonly known as the bird's head or bird's beak problem, wherein the field oxide extends under the masking nitride layer to consume some of the usable active area. Additional problems routinely encountered with known field oxide formation processes include stress induced dislocations at the edges of the active region, and the presence of a relatively nonplanar surface in or adjacent the fully formed field oxide. The nonplanar recesses or notches at the edges of the active region often trap conductive layer residuals, creating short circuit paths. Solutions to these problems have been proposed, but as a routine, involve relatively complex or dimensionally critical fabrication sequences which are costly to practice or degrade the semiconductor chip yield.

The importance of overcoming the various deficiencies noted above is evidenced by the extensive technological development directed to the subject, as documented by the relevant patent and technical literature. The closest and apparently most relevant technical developments in the patent literature can be gleaned by considering U.S. Pat. Nos. 3,958,040; 4,398,992; 4,088,516; 4,333,965; 4,563,227; 4,564,394; 4,622,096 and 4,631,219. Relevant technical literature includes the article entitled "Isolation Technology For Scaled MOS VLSI" by Oldham, which appeared as paper 9.1 in IEDM 82, pages 216–219; the article entitled "A Bird's Beak Free Local Oxidation Technology Feasible For VSLI Circuits Fabrication" by Chiu et al., which appeared in the IEEE Transactions On Electron Devices, pages 536–540, April 1982; the article entitled "The Sloped-Wall SWAMI—A Defect-Free Zero Bird's-Beak Local Oxidation Process For Scaled VLSI Technology" by Chiu et al., which appeared in the IEEE Transactions On Electron Devices, pages 1506–1511, November 1983; the article entitled "Defect Characteristics And Generation Mechanism In A Bird Beak Free Structure By Sidewall Masked Technique" by Fang et al., which appeared in the Journal of Electrochemical Society, pages 190–196, 1983; the article entitled "A New Fully Recessed-Oxide (FUROX) Field Isolation Technology For Scaled VLSI Circuit Fabrication" by Tsai et al., which appeared in the IEEE Electron Device Letters, pages 124–126, February 1986; the article entitled "A Method For Saving Planar Isolation Oxides Using Oxidation Protected Sidewalls" by Kahng et al., which appeared in the Journal of Electrochemical Society, pages 2468–2471, November 1980; the article entitled "The SWAMI—A Defect Free And Near-Zero Bird's-Beak Local Oxidation Process And Its Application In VLSI Technology" by Chiu et al., which appeared as pages 9.3 in IEDM 82, pages 224–227, 1982; the article entitled "Defect Free Process Of A Bird's Beak Reduced LOCOS" by Inuishi et al., which appeared as Abstract No. 273 in an unknown publication, pages 409–410, of 1985 or later date; and the article entitled "Optimization of Sidewall Masked Isolation Process" by Teng et al., which appears in IEEE Journal of Solid-State Circuits, pages 44–51, February 1985. The diversity and complexity of the various technical approaches substantiates the difficulty and importance of developing a commercially viable process for isolating active regions in a silicon substrate during the fabrication of integrated circuits.

Though a number of the techniques successfully attack and solve the bird's head or bird's beak problem, and usually provide relatively planar final concluding surfaces, the approaches routinely create stress induced dislocations at the edges of the active regions, and form topologies which include notches or grooves of sufficient dimension to trap residuals of subsequently deposited conductive materials. The stress induced dislocations are often not even recognized, while the notches or grooves are most often visible in the SEM cross-sections of the final structures.

The present process recognizes these various deficiencies and selectively refines and combines fabrication concepts to suppress the bird's beak formation, provide a relatively planar concluding surface, suppress stress induced dislocations at the edges of the active silicon, and avoid the formation of notches at the edge of the active silicon. These accomplishments are attained with the addition of only one low pressure chemical vapor deposition of nitride step and one anisotropic etched step beyond the steps used to practice the classic LOCOS process.

Generally, the process of the present invention utilizes a relatively thick first pad oxide layer under a relatively thick first nitride layer, a very thin conformally deposited second nitride layer with no underlying pad oxide, a match of the growth of the silicon dioxide from the substrate recess with the oxidation consumption of the thin second nitride layer, and a time and position coincidence of the field oxide vertical propagation with the level of the first pad oxide. According to a preferred practice of the invention, the active regions of a silicon substrate are covered with a pad silicon dioxide layer to a thickness in the range of 50 nm or greater and an LPCVD first silicon nitride layer to a nominal thickness of 100 nm or greater, e.g. 200 nm. The structure is then photolithographically processed to retain masking photoresist patterns over the active regions. An RIE or other anisotropic etch thereafter successively removes the unmasked nitride layer, the underlying pad oxide layer, and the silicon substrate to a nominal recess depth of 120 nm, to create trenched regions with substantially vertical sidewalls. The formation of a thin LPCVD silicon nitride layer follows, conformally deposited to a nominal thickness of 13 nm or less. An anisotropic etch to remove silicon nitride from the horizontal surfaces follows next, retaining approximately 12 nm or less of the second silicon nitride layer material on the vertical sidewalls. The field oxide is then grown from the substrate until the lifting/bending and oxidation of the thin sidewall of silicon nitride results in a complete junction of the grown field oxide with the pad oxide.

Attention is now directed to the cross-section in FIG. 1 of the drawings, where a preferred practice of the invention is shown as first commenced to form a silicon dioxide dielectric field oxide region in a monocrystalline silicon substrate 1. To create the structure in FIG. 1, the silicon substrate 1 is first thermally oxidized to form a pad oxide layer 2 having a nominal thickness of at least 37.5 nm, a thickness significantly greater than the conventional practice of having a 10–20 nanometer pad oxide layer to relieve differential coefficient of expansion stresses. The relatively thick pad oxide layer 2 actually performs two somewhat distinct functions, the first being the relief of the shear stress, according to normal practice, and second the relief of expansion induce compressive stress at the active region corner, in a manner to be described later. A pad oxide of conventional thickness will not suffice to perform both functions.

As further shown in FIG. 1, pad oxide 2 on substrate 1 is then covered by a silicon nitride I layer 3 preferably to a nominal thickness of 200 nm by LPCVD. Thereupon, a photoresist is deposited and photolithographically processed to retain a photoresist (PR) mask pattern 4 exposing nitride I layer 3 at opening 6, generally corresponding to the field oxide formation region between active regions 5 in substrate 1.

Figure 2:
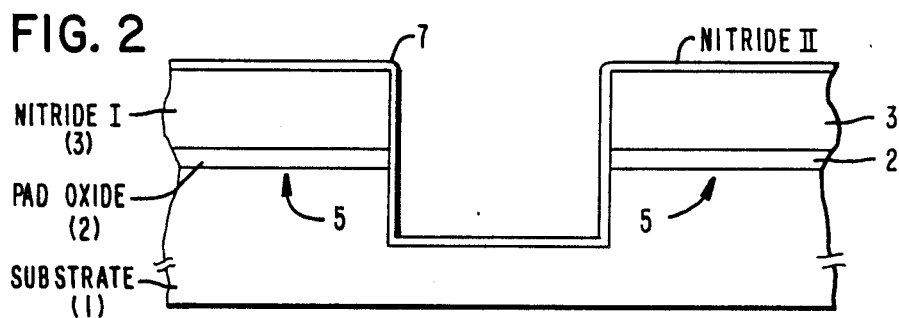

To reach the stage of fabrication depicted in FIG. 2, the structure in FIG. 1 is anisotropically etched using a conventional reactive ion etching (RIE) process to remove nitride I layer not masked by photoresist 4, the aligned segment of pad oxide layer 2, and then a section of substrate 1 suitable to form a recess approximately 120 nanometers deep into substrate 1. Following the strip of photoresist 4, substrate 1 is conformally covered by an LPCVD silicon 1 nitride II layer 7 to a nominal thickness of 10–13 nm.

Figure 3:
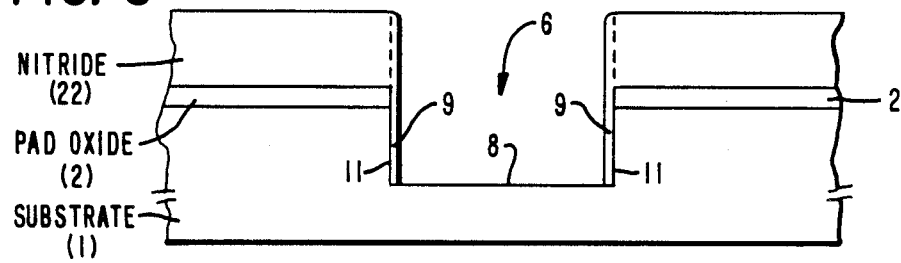

The structure in FIG. 2 is then subjected to another anisotropic etch, this etch serving to remove at least 13 nanometers of silicon nitride from exposed horizontal surfaces. As a consequence of such anisotropic etch, as shown in FIG. 3, the bottom surface 8 of the recess at location 6 in silicon substrate 1 is exposed, while sidewall silicon nitride II layer 9 is retained but thinned by a nominal one nanometer.

Note that no pad oxide underlies sidewall nitride 9, thereby inhibiting the movement of oxygen species along the underside of sidewall nitride layer 9 during thermal field oxide growth. Clearly, oxygen species are also blocked from direct access to pad oxide layer by sidewall nitride layer 9 during the initial stages of field oxide growth. The dimensions of sidewall nitride layer 9 are relatively crucial, not only in controlling the oxidation effects, but also in avoiding coefficient of expansion differential induced stress damage along sidewalls 11 of silicon substrate 1. Namely, sidewall nitride 9 is sufficiently thin at 12 nm to yield rather than cause stress damage to silicon substrate 1. Sidewall 11 is oxidized at a rate suitable to facilitate bending and lifting with silicon dioxide growth, yet is sufficiently thick to block oxidizing species access to the pad oxide region until the specifically desired time.

Although no pad or stress relief oxide underlies sidewall nitride 9, a thin oxide layer such as a native oxide or screening oxide may nonetheless underlie nitride 9. Native oxide on the order of 2 nm naturally forms prior to the formation of nitride 9. Screening oxide may intentionally be thermally grown in some circumstances to prevent contamination. For example, NMOS transistors may involve a field implant in substrate 1 to act as a channel stop. This implant is done prior to the growth of field oxide in opening 6. In a CMOS device the field oxide will separate NMOS and PMOS transistors. For such device the PMOS side of opening 6 is masked with photoresist prior to the field implant in the NMOS side. Because photoresist materials typically include elements which may contaminate substrate 1, and because photoresist adhesion to silicon is relatively poor, a thin screening oxide layer with nominal thickness of less than 20 nm and preferably about 10 nm may be thermally grown prior to the application of the photoresist. In addition, a screening oxide may also be applied on the sidewall of the NMOS side of opening 6 to prevent contamination during field implantation. After the field implant, the photoresist is removed. The screening oxide may also be removed. However, since the screening oxide is so thin, it is not necessary to remove it prior to the application of nitride II layer 7, shown in FIG. 2. It has been found that the presence of the screening oxide does not degrade the process, i.e., the screening oxide is sufficiently thin so that there is no significant increase in lateral encroachment during field oxide growth.

Figure 4A:
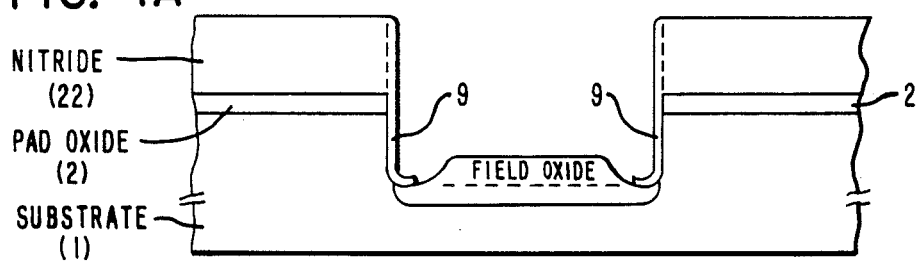
FIGS. 4A–4C schematically illustrate in the cross-section progressive stages of the field oxide growth when practiced according to the present invention.
Figure 4B:
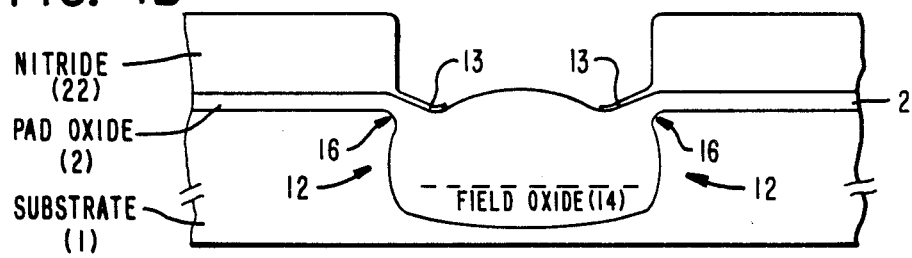
Figure 4C:
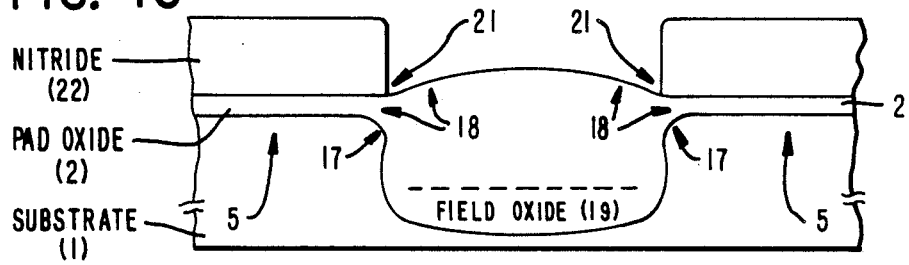

FIGS. 4A–4C depict the structure at various stages in the growth of the field oxide, using a preferred field oxidation environment of $H_2+O_2$, at a nominal temperature of approximately 900° C. for a nominal time of 750 minutes. As the field oxide growth continues in progressing to the structure shown in FIG. 4B, the former sidewall nitride layer 9 is fully lifted and bent. During this time, stress in sidewall regions 12 of silicon substrate 1 is relieved by the presence of the thin sidewall nitride at the commencement of oxidation and its further thinning by surface conversion to oxide during oxidation. At the stage of oxidation depicted in FIG. 4B, nitride layers 13 would be thinned to approximately 3 nm or less.

FIG. 4B also illustrates that the lifting of the residual sidewall silicon nitride 13 exposes the relatively thick pad oxide 2 near the end of oxidation. Pad oxide 2 then serves as a path for relieving volumetric increase stresses in field oxide 14 proximate silicon substrate corners 16, corners which otherwise would be likely to encounter stress induced dislocations. As the field oxide growth continues into the final stage depicted in FIG. 4C, conversion of residual sidewall silicon nitride 13 to oxide opens a relatively short path for oxygen species to reach silicon substrate corners 16. The result is an accentuated oxidation rate at silicon substrate corners 16 to create corners 17 of relatively large radius, smooth contour, and reduced local stress. Again, the relatively thick pad oxide layer 2 provides a yielding path for the relief of localizes stresses, which path supplements the vertically directed movement and relief in the region 18. Furthermore, the relatively limited growth of field oxide 19 over the lower corner regions 21 of nitride layer 22, by virtue of the masking by sidewall nitride layer 13 (FIG. 4B), substantially suppresses the formation of notches or grooves in the field oxide at the edges of the active regions 5.

As a consequence of the balanced interaction between the lifting and bending of the sidewall nitride layer, the conversion of the sidewall nitride to an oxide, the relief of stress through the pad oxide, the accentuated conversion of the silicon substrate at the edge of the active region near the conclusion of the oxidation step, and the multidirectional relief of stresses at the relatively rounded edges of the active regions, not only is the bird's beak problem substantially suppressed, but the active region does not experience stress induced dislocations nor does the structure of the field oxide incorporate deleterious notches or grooves. Foremost, the desirable features are obtained by the addition of only two noncritical fabrication steps, through a judicious refinement of dimensions and operations.

Figure 5:
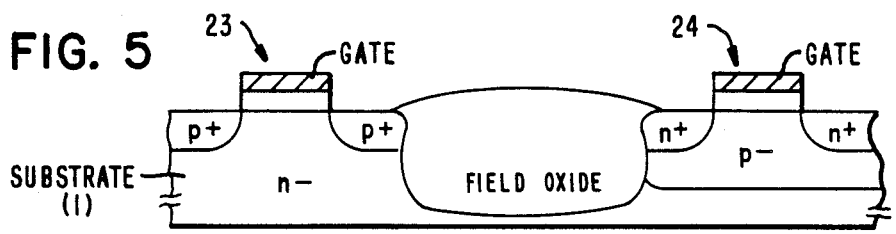
FIG. 5 schematically illustrates, in cross-section, a composite integrated circuit structure of active regions separated by a field oxide region.

FIG. 5 illustrates a representative concluding integrated circuit structure, following the removal of the masking nitride 22 (FIG. 4C) and an oxide layer including pad oxide 2, followed by the selective formation of exemplary CMOS field effect transistors, such as the p-channel device at 23 and the n-channel device at 24.

I claim:
1. A process for forming field oxide regions between active regions in a semiconductor substrate, comprising the steps of:
   forming over the substrate active regions a pad oxide layer;
   forming over the pad oxide layer a first silicon nitride layer;
   selectively etching through the first nitride layer, the pad oxide layer, and into the substrate to expose the substrate and the pad oxide layer and to define field oxide regions with substantially vertical sidewalls;
   forming a relatively thin screening oxide on the exposed substrate and pad oxide layer on said sidewalls;

doping selected regions of said substrate through selected horizontally disposed surfaces of said substrate underlying said field oxide regions;

forming a conformal second silicon nitride layer, over the patterned structure of the substrate and layers including the substantially vertical sidewalls, to a nominal thickness of 10-13 nm;

selectively removing said second silicon nitride layer to expose horizontally disposed surfaces of the substrate, while retaining second silicon nitride on the substantially vertical sidewalls;

oxidizing the exposed substrate and second silicon nitride in a proportion to effectuate concurrent oxidation and lifting and bending, beginning at the low edge of the retained sidewall silicon nitride; and continuing the oxidation of the substrate and the lifting of the sidewall silicon nitride until the upper surface of the oxidized substrate reaches a predetermined level.

2. The process of claim 1 wherein said first silicon nitride layer is formed to a thickness in the range of 100 nm or greater.

3. The process of claim 1 wherein said screening oxide has a thickness of less than 20 nm.

4. A structure for fabricating an integrated circuit comprising:

a silicon substrate;

a pad oxide layer overlying said substrate;

a first nitride layer overlying said pad oxide layer;

an opening through said first nitride and pad oxide layer and into said silicon substrate defining a region for field oxide growth, comprising a sidewall surface and an adjoining bottom surface; and a second nitride layer having a nominal thickness of 9-13 nm overlying said sidewall surface.

5. The structure of claim 4 wherein said sidewall surface is substantially vertical with respect to said bottom surface, said pad oxide layer and said first nitride layer.

6. The structure of claim 4 wherein said second nitride layer has a nominal thickness of 9-12 nm, and said bottom surface of said opening consists essentially of exposed substrate silicon.

7. The structure of claim 4 wherein said pad oxide layer has a nominal thickness significantly greater than 10-20 nm.

8. The structure of claim 7 wherein said pad oxide layer has a thickness of at least 37.5 nm.

9. The structure of claim 4 wherein said first nitride layer has a thickness greater than 100 nm.

10. The structure of claim 4 wherein the depth of said opening into said substrate is about 120 nm.

11. The structure of claim 4 further comprising:

a thin screening oxide disposed between said sidewall surface of said opening and said second nitride layer.

12. The structure of claim 11 wherein said screening oxide has a thickness of less than 20 nm.

* * * * *

UNITED STATES PATENT AND TRADEMARK OFFICE
CERTIFICATE OF CORRECTION

PATENT NO. : 4,986,879

DATED : January 22, 1991

INVENTOR(S) : Steven S. Lee

It is certified that error appears in the above-identified patent and that said Letters Patent is hereby corrected as shown below:

TITLE PAGE: delete "[21] Appl. No.: 436,567" and insert -- [21] Appl. No.: 496,567 --

Signed and Sealed this

Second Day of June, 1992

Attest:

DOUGLAS B. COMER

Attesting Officer

Acting Commissioner of Patents and Trademarks